(12) United States Patent
Huang et al.

(10) Patent No.: US 8,269,536 B2
(45) Date of Patent: Sep. 18, 2012

(54) ONION WAVEFORM GENERATOR AND SPREAD SPECTRUM CLOCK GENERATOR USING THE SAME

(75) Inventors: Hong-Yi Huang, Taipei (TW); Chih-Yuan Hsu, Taipei (TW); Wei-Sheng Tseng, Nantou County (TW); Kuo-Hsing Cheng, Taipei (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 60 days.

(21) Appl. No.: 12/871,920

(22) Filed: Aug. 31, 2010

(65) Prior Publication Data
US 2011/0156782 A1    Jun. 30, 2011

(30) Foreign Application Priority Data
Dec. 30, 2009  (TW) .............................. 98145813 A

(51) Int. Cl.
*H03L 7/06* (2006.01)
(52) U.S. Cl. ....................... 327/159; 327/160
(58) Field of Classification Search .................. None
See application file for complete search history.

(56) References Cited

U.S. PATENT DOCUMENTS

| | | | |
|---|---|---|---|
| 4,979,183 A | 12/1990 | Cowart | |
| 5,488,627 A | 1/1996 | Hardin et al. | |
| 5,539,770 A | 7/1996 | Ishigaki | |
| 5,610,955 A | 3/1997 | Bland | |
| 5,631,920 A | 5/1997 | Hardin | |
| 5,659,587 A | 8/1997 | Knierim | |
| 5,943,382 A | 8/1999 | Li et al. | |
| 6,003,053 A * | 12/1999 | Tanaka et al. | 708/103 |
| 6,198,355 B1 * | 3/2001 | Lindquist et al. | 331/27 |
| 6,292,507 B1 | 9/2001 | Hardin et al. | |
| 6,366,174 B1 | 4/2002 | Berry et al. | |
| 6,404,834 B1 | 6/2002 | Hardin et al. | |
| 6,559,698 B1 | 5/2003 | Miyabe | |
| 6,647,052 B2 | 11/2003 | Hailey | |
| 6,703,902 B2 | 3/2004 | Jeon et al. | |
| 7,015,733 B2 * | 3/2006 | Giuroiu | 327/156 |
| 7,161,970 B2 | 1/2007 | Lim et al. | |
| 7,532,139 B2 * | 5/2009 | Swain | 341/144 |
| 7,714,666 B2 * | 5/2010 | Ke et al. | 331/16 |

OTHER PUBLICATIONS

Ding Shiuan Shen and S. I. Liu, "A low-jjitter spread spectrum clock generator using FDMP," IEEE Trans. on Circuits and Systems, Part II, pp. 979-983, Nov. 2007.
Hyung Rok Lee, O. Kim and G. Ahn, "A low-jitter 5000ppm spread spectrum clock generator for multi-channel SATA transceiver in 0.18um CMOS," in IEEE Int. Solid-State Circuits Dig. Conf., 2005, pp. 162-163.

(Continued)

*Primary Examiner* — An Luu
(74) *Attorney, Agent, or Firm* — Jianq Chyun IP Office

(57) ABSTRACT

An onion waveform generator and a spread spectrum clock generator (SSCG) using the same are provided. The onion waveform generator includes a value generation unit and an accumulating unit. The value generation unit outputs a counting value. The accumulating unit accumulates the counting value to output a waveform value. The accumulating unit switches from an increasing mode to a decreasing mode if the waveform value is a third boundary value, and the accumulating unit switches from the decreasing mode to the increasing mode if the waveform value is a fourth boundary value.

32 Claims, 12 Drawing Sheets

OTHER PUBLICATIONS

Jongshin Shin, I. Seo, J. Y. Kim and S. H. Yang, "A low-jitter added SSCG with seamless phase selection and fast AFC for 3rd generation Serial-ATA," in Proc. IEEE Custom Integrated Circuit Conf., 2006, pp. 409-412.

Wei-Ta Chen, J. C. Hsu, H. W. Lune and C. C. Su, "A spread spectrum clock generator for SATA—II," in Proc. IEEE Int. Symp. on Circuits and Systems, 2005, pp. 2643-2646.

Minyoung Song, S. Ahn, I. Jung, Y. Kim and C. Kim, "A 1.5 GHz spread spectrum clock generator with a 5000ppm piecewise linear modulation," IEEE Custom Integrated Circuits Conf., Sep. 2008, pp. 455-458.

Ian A. Young, J.K. Greason, and K.L. Wong, "A PLL clock generator with 5 to 110-MHz of lock range for microprocessors," IEEE J. Solid-State Circuits, vol. 27, pp. 1599-1607, Mar. 1992.

Masaru et al. "Spread-specrrum clock generator for Serial ATA using fractional PLL controlled by ΔΣmodulator with level shifter," IEEE Int. Solid-State Circuits Conf. , vol. 1, 2005.

Jonghoon Kim and P. Jun, "Dithered time spread spectrum clock generator for reduction of electromagnetic radiated emission from high-speed digital system," IEEE Int. Symposium on Electro-magnetic Compatibility, Aug. 2002.

Hung Sung Li, Y. C. Cheng, and D. Puar "Dual-loop spread-spectrum clock generator," in IEEE Int. Solid-State Circuit Conf., pp. 184-186, 1999.

Ping Ying Wang and Shang-Ping Chen, "Spread spectrum clock generator," in Proc. IEEE Asian Solid-State Circuits Conf., 2007 ,pp. 304-307.

Keith B. Hardin, J. T. Fessler, and D. R. Bush, "Spread-spectrum clock generation for the reduction of radiated emissions," in Proc. IEEE Int. Symp. Electromagnetic Compatibility, pp. 227-231, 1994.

Hyung-Rok Lee, "A Low-Jitter 5000ppm Spread Spectrum Clock Generator for Multi-channel SATA Transceiver in 0.18 m CMOS", 2005 IEEE International Solid-State Circuits Conference, Feb. 8, 2005, pp. 162,163 and 590.

Hsiang-Hui Chang, "A Spread-Spectrum Clock Generator With Triangular Modulation", IEEE Journal of Solid-State Circuits, vol. 38, No. 4, Apr. 2003, pp. 673-676.

* cited by examiner

ONION WAVEFORM GENERATOR AND
SPREAD SPECTRUM CLOCK GENERATOR
USING THE SAME

CROSS-REFERENCE TO RELATED
APPLICATION

This application claims the priority benefit of Taiwan application serial no. 98145813, filed on Dec. 30, 2009. The entirety of the above-mentioned patent application is hereby incorporated by reference herein and made a part of this specification.

BACKGROUND

1. Technical Field

The present disclosure generally relates to a waveform generator, and more particularly, to an onion waveform generator and a spread spectrum clock generator (SSCG) using the same.

2. Description of Related Art

A spread spectrum clock generator (SSCG) gradually modulates a system clock to allow the working frequency to change within a specific range, so that the radiation energy produced by the system clock can be evenly distributed in a small segment of a spectrum and the formation of an energy peak at a single frequency can be avoided. Thereby, through a spread spectrum technique, electromagnetic radiation energy can be distributed so that the radiation of electromagnetic interference (EMI) can be reduced.

FIGS. 1A-1B illustrate output spectra obtained by using different modulation waveforms. Presently, delta-sigma ($\Delta\Sigma$) modulation is mostly adopted in SSCGs. A characteristic of $\Delta\Sigma$ modulation is that the spread spectrum effect of $\Delta\Sigma$ modulation is not affected by process temperature or voltage. Referring to FIG. 1A, in the output spectrum obtained by using the sine waveform for spread spectrum modulation, a depressed power attenuation and accordingly two raised ends are produced, as shown in FIG. 1A. Namely, because the spectral energy is not evenly distributed on the extended frequencies, the maximum energy attenuation is not achieved and accordingly the spread spectrum effect is not so satisfactory.

Referring to FIG. 1B, in another conventional technique, a triangular waveform is used for $\Delta\Sigma$ modulation. The triangular waveform modulation technique is the most commonly used technique in existing SSCGs. However, as shown in FIG. 1B, in a SSCG adopting the triangular waveform modulation, the power at the middle of the extended frequency range is still slightly depressed. Thus, the raised ends still exists in the output spectrum, and the spread spectrum effect is still not so satisfactory.

SUMMARY

Accordingly, the present disclosure is an onion waveform generator, wherein a value generation unit and an accumulating unit are adopted for generating a nonlinear onion modulation waveform.

The present disclosure is directed to a spread spectrum clock generator (SSCG), wherein the nonlinear onion waveform modulation such that an optimal spread spectrum effect is achieved.

According to an embodiment of the present disclosure, an onion waveform generator including a value generation unit and an accumulating unit is provided. The value generation unit outputs a counting value. The accumulating unit coupled to the value generation unit accumulates the counting value to output a waveform value. The accumulating unit switches from an increasing mode to a decreasing mode if the waveform value is a third boundary value, and the accumulating unit switches from the decreasing mode to the increasing mode if the waveform value is a fourth boundary value.

According to an embodiment of the present disclosure, a SSCG including a phase frequency detector (PFD), a filter, a controlled oscillator, a programmable frequency divider, a modulator, and an onion waveform generator is provided. The PFD receives and detects the difference between a reference clock and a feedback clock to obtain a detection result. The input terminal of the filter is coupled to the PFD for receiving the detection result. The control terminal of the controlled oscillator is coupled to the output terminal of the filter, and the output terminal of the controlled oscillator provides a spread spectrum clock. The input terminal of the programmable frequency divider is coupled to the output terminal of the controlled oscillator, and the output terminal of the programmable frequency divider provides the feedback clock to the PFD. The programmable frequency divider dynamically determines the frequency of the feedback clock according to a modulation control signal received from the modulator. The modulator generates the modulation control signal according to a waveform value received from the onion waveform generator, so as to control the programmable frequency divider. The onion waveform generator includes a value generation unit and an accumulating unit. The value generation unit outputs a counting value. The accumulating unit coupled to the value generation unit accumulates the counting value to output the waveform value to the modulator. The accumulating unit switches from an increasing mode to a decreasing mode if the waveform value is a third boundary value, and the accumulating unit switches from the decreasing mode to the increasing mode if the waveform value is a fourth boundary value.

As described above, in embodiments of the present disclosure, a nonlinear onion waveform generator is implemented by adopting a value generation unit and an accumulating unit. In a SSCG using the onion waveform generator for modulation, the spectral energy is evenly distributed on extended frequencies, and the problem of raised ends of the spectrum is effectively resolved. Thereby, a more satisfactory spread spectrum effect is achieved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
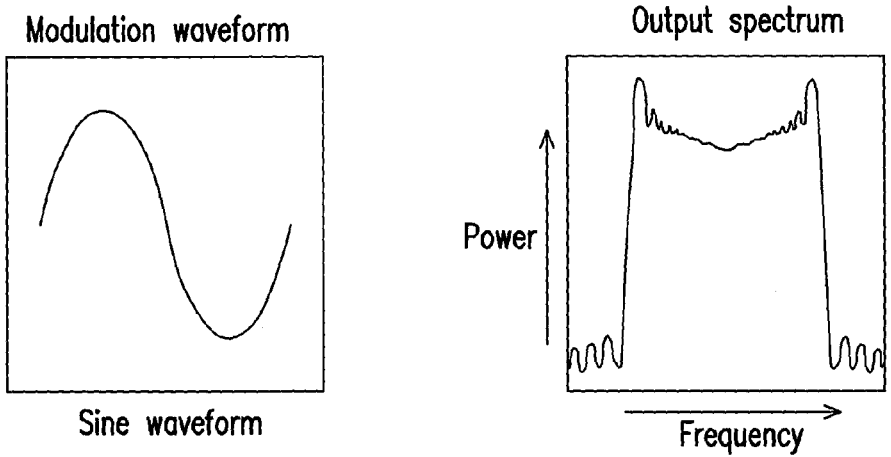
FIGS. 1A-1C illustrate output spectra obtained by using different modulation waveforms.
Figure 1B:
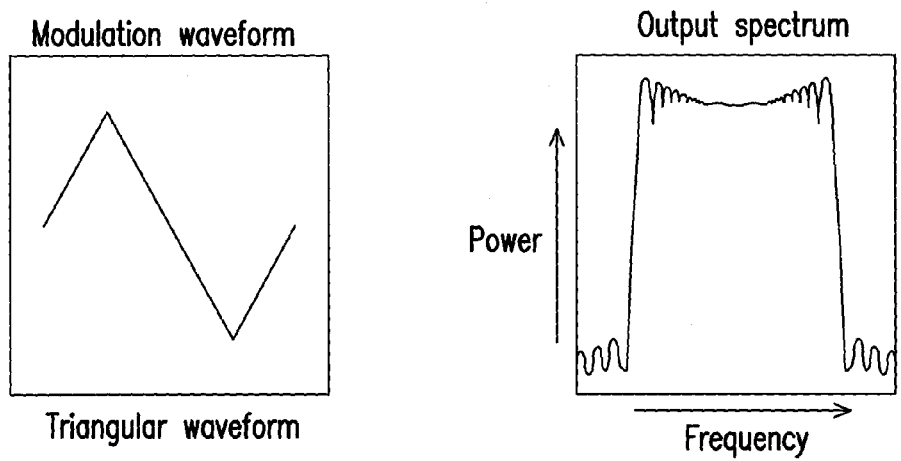

Reference will now be made in detail to the present preferred embodiments of the disclosure, examples of which are illustrated in the accompanying drawings. Wherever possible, the same reference numbers are used in the drawings and the description to refer to the same or like parts.

Figure 1C:
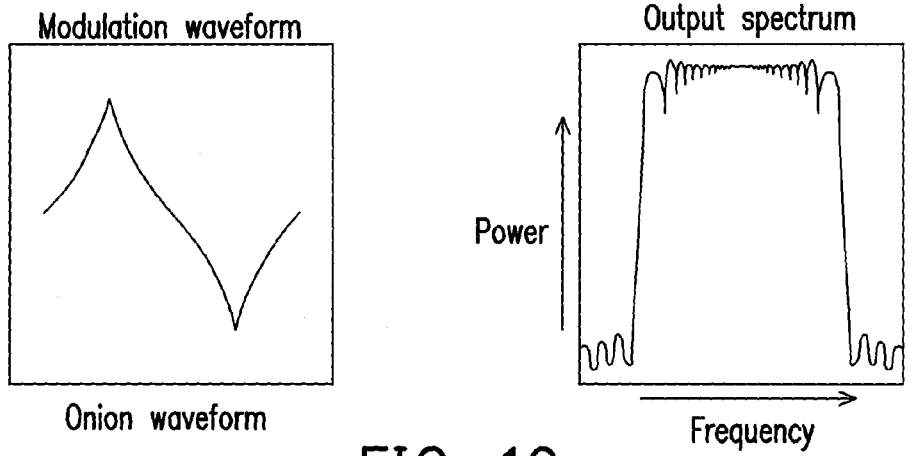

In following embodiments, an onion waveform is adopted for delta-sigma ($\Delta\Sigma$) modulation, as shown in FIG. 1C, and the onion waveform produces the optimal spread spectrum effect. Because the onion waveform is nonlinear, it is difficult to realize an onion waveform generator through the conventional technique. In some embodiments, the onion waveform generator stores a great many onion waveform values for $\Delta\Sigma$ modulation in a read-only memory (ROM) as a look-up table. This technique is difficult to implement regarding the circuit and produces a chip of a large area and high power consumption. Below, some examples of the onion waveform generator will be described to simplify foregoing ROM circuit design and reduce the power consumption and hardware area.

Figure 2:
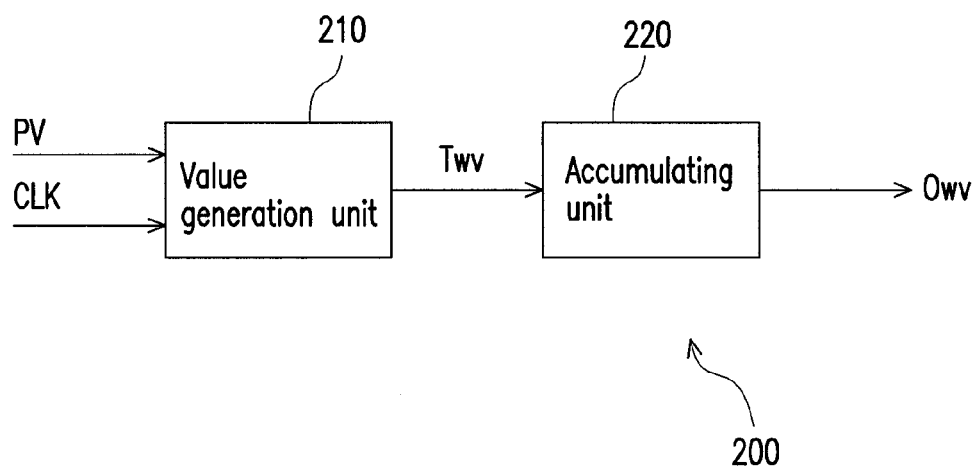
FIG. 2 is a schematic block diagram of an onion waveform generator according to an embodiment of the present disclosure.

FIG. 2 is a schematic block diagram of an onion waveform generator 200 according to an embodiment of the present disclosure. Referring to FIG. 2, the onion waveform generator 200 includes a value generation unit 210 and an accumulating unit 220. The value generation unit 210 continuously outputs a series of values. Below, the values generated by the value generation unit 210 are referred to as a counting value Twv. The value generation unit 210 can be implemented by those skilled in the art through any technique. For example, the value generation unit 210 may be a random number generator or a counter, wherein the counter may be a linear counter, a nonlinear counter, or a finite state machine (FSM).

In some embodiments, the value generation unit 210 can be implemented with an accumulator triggered by a clock signal CLK for accumulating a predefined value PV to output a counting value Twv. The predefined value PV can be a constant (e.g. a logic value "1" or other logic value) or a variability value (e.g. random value). In another embodiment, the value generation unit 210 is implemented with a counter. The counter counts a clock signal CLK to output the counting value Twv. The counter dynamically operates in a count-up mode or a count-down mode. The counter switches from the count-up mode to the count-down mode if the counting value Twv is a first boundary value, and the counter switches from the count-down mode to the count-up mode if the counting value Twv is a second boundary value.

In the count-up mode, the value generation unit 210 increasingly counts the clock signal CLK to output the counting value Twv. For example, the value generation unit 210 sequentially outputs 0, 1, 2, 3, . . . or 0, 3, 6, 9, . . . or other linear counting values as the counting value Twv according to the counting result. The value generation unit 210 may also sequentially output 2, 3, 3, 4, 4, 4, 5, . . . or 1, 1, 1, 2, 3, 3, . . . or other nonlinear counting values as the counting value Twv according to the actual design requirement. On the other hand, in the count-down mode, the value generation unit 210 decreasingly counts the clock signal CLK to output the counting value Twv. For example, the value generation unit 210 sequentially outputs . . . , 9, 8, 7, 6, . . . or . . . , 9, 6, 3, 0, . . . or other linear counting values as the counting value Twv according to the counting result. However, the counting values Twv may also be nonlinear values, such as . . . , 4, 4, 4, 3, 3, 2, . . . or . . . , 3, 3, 2, 1, 1, 1, . . . or other nonlinear counting values.

The value generation unit 210 may also be FSM composed of sequential logic and combinational logic and continuously output a state value sequence (for example, . . . 1, 2, 1, 2, 2, 3, 2, 3, . . . or . . . , 3, 2, 3, 2, 2, 1, 2, 1, . . . ), so that the accumulating unit 220 can output any spread spectrum modulation waveform. The counting value Twv output by the value generation unit 210 is between the first boundary value and the second boundary value.

The accumulating unit 220 is coupled to the value generation unit 210, and which accumulates the counting value Twv to output a waveform value Owv. The accumulating unit 220 dynamically operates in an increasing mode or a decreasing mode. In the increasing mode, the value generation unit 210 performs an additive operation to accumulate the counting value Twv and output the waveform value Owv. In the decreasing mode, the value generation unit 210 performs a subtractive operation to accumulate the counting value Twv and output the waveform value Owv. The accumulating unit 220 switches from the increasing mode to the decreasing mode if the waveform value Owv is a third boundary value, and the accumulating unit 220 switches from the decreasing mode to the increasing mode if the waveform value Owv is a fourth boundary value.

Figure 3:
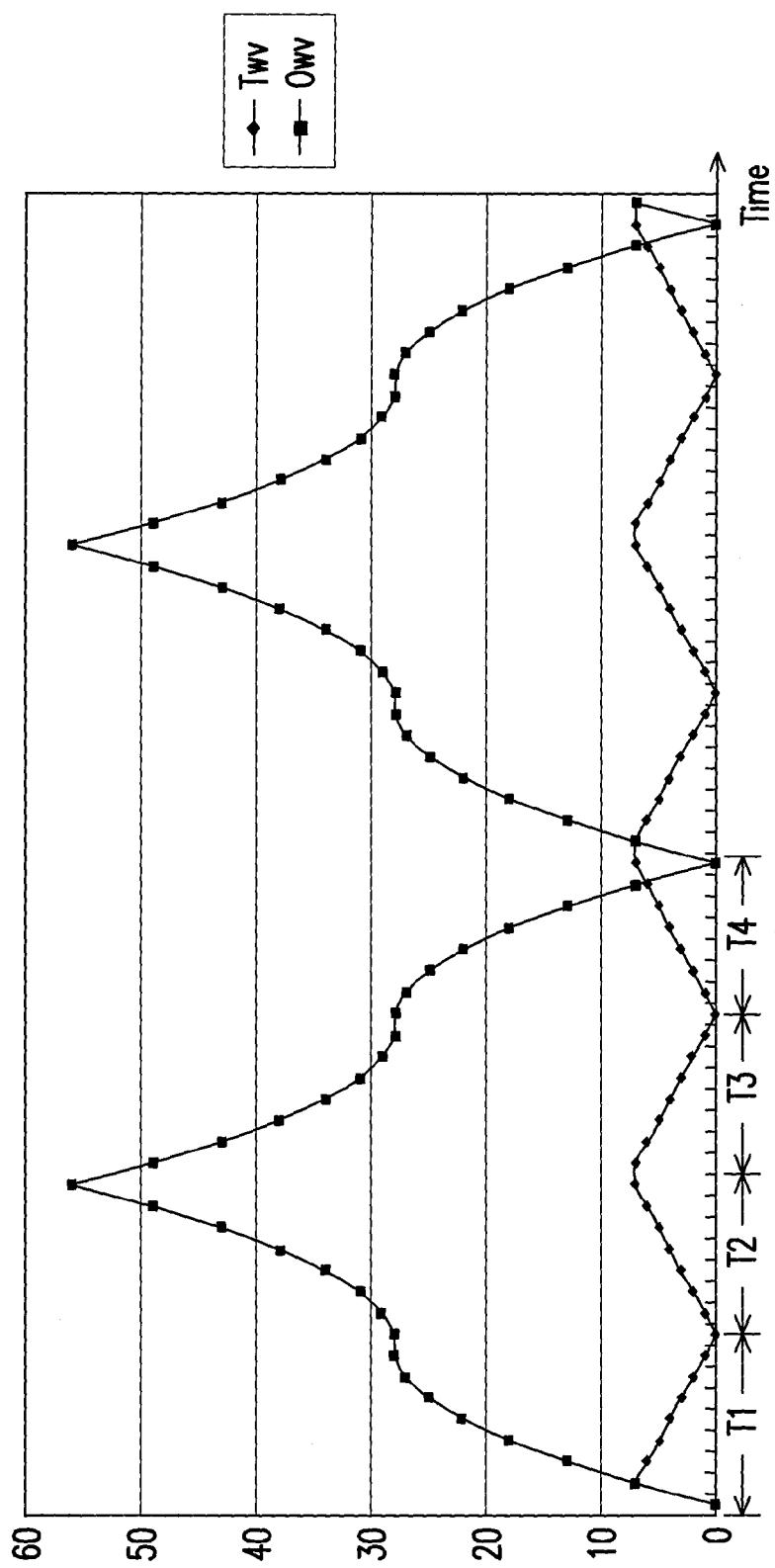
FIG. 3 illustrates waveforms of a counting value Twv and a waveform value Owv in FIG. 2 according to an embodiment of the present disclosure.

In some embodiments, the accumulation mode of the accumulating unit 220 is changed when the counting value Twv reaches the first boundary value. For example, the first boundary value is 7, the second boundary value is 0, the third boundary value is 56, and the fourth boundary value is 0. FIG. 3 illustrates the waveforms of the counting value Twv and the waveform value Owv in FIG. 2 according to an embodiment of the present disclosure. In the count-down mode (for example, the period T1 as shown in FIG. 3), the value generation unit 210 decreasingly counts the clock signal CLK to sequentially output 7, 6, 5, 4, 3, 2, 1, and 0 as the counting value Twv. During the period T1, the accumulating unit 220 operates in the increasing mode and accumulates the counting value Twv to sequentially output 7, 13, 18, 22, 25, 27, 28, and 28 as the waveform value Owv. Because the counting value Twv is the second boundary value (i.e., 0), the value generation unit 210 switches into the count-up mode.

In the count-up mode (for example, the period T2 as shown in FIG. 3), the value generation unit 210 increasingly counts the clock signal CLK to sequentially output 1, 2, 3, 4, 5, 6, and 7 as the counting value Twv. During the period T2, because the waveform value Owv has not reached the third boundary value (i.e., 56) yet, the accumulating unit 220 still operates in the increasing mode and accumulates the counting value Twv to sequentially output 29, 31, 34, 38, 43, 49, and 56 as the waveform value Owv. Because the counting value Twv has reached the first boundary value (i.e., 7), the value generation unit 210 switches into the count-down mode. In addition, because the waveform value Owv has reached the third boundary value (i.e., 56), the accumulating unit 220 switches into the decreasing mode.

In the count-down mode (for example, the period T3 as shown in FIG. 3), the value generation unit 210 counts the clock signal CLK to sequentially output 7, 6, 5, 4, 3, 2, 1, and 0 as the counting value Twv. During the period T3, the accumulating unit 220 operates in the decreasing mode and accumulates the counting value Twv to sequentially output 49, 43, 38, 34, 31, 29, 28, and 28 as the waveform value Owv. Because the counting value Twv has reached the second boundary value (i.e., 0), the value generation unit 210 switches into the count-up mode.

In the count-up mode (for example, the period T4 as shown in FIG. 3), the value generation unit 210 counts the clock signal CLK to sequentially output 1, 2, 3, 4, 5, 6, and 7 as the counting value Twv. During the period T4, because the waveform value Owv has not reached the fourth boundary value (i.e., 0), the accumulating unit 220 still operates in the decreasing mode and accumulates the counting value Twv to sequentially output 27, 25, 22, 18, 13, 7, and 0 as the waveform value Owv. Because the counting value Twv has reached the first boundary value (i.e., 7), the value generation unit 210 switches into the count-down mode. In addition, because the waveform value Owv has reached the fourth boundary value (i.e., 0), the accumulating unit 220 switches into the decreasing mode. Subsequent operations can be deduced based on foregoing description. The counting values Twv and the waveform values Owv are listed in following table 1.

TABLE 1

| The counting value Twv and the waveform value Owv in FIG. 3 | | | | | | | | | | | | | | | |
|---|---|---|---|---|---|---|---|---|---|---|---|---|---|---|---|
| Period | | | T1 | | | | | | | | | T2 | | | |
| Twv | 7 | 6 | 5 | 4 | 3 | 2 | 1 | 0 | 1 | 2 | 3 | 4 | 5 | 6 | 7 |
| Owv | 7 | 13 | 18 | 22 | 25 | 27 | 28 | 28 | 29 | 31 | 34 | 38 | 43 | 49 | 56 |
| Period | | | T3 | | | | | | | | | T4 | | | |
| Twv | 7 | 6 | 5 | 4 | 3 | 2 | 1 | 0 | 1 | 2 | 3 | 4 | 5 | 6 | 7 |
| Owv | 49 | 43 | 38 | 34 | 31 | 29 | 28 | 28 | 27 | 25 | 22 | 18 | 13 | 7 | 0 |

Figure 4:
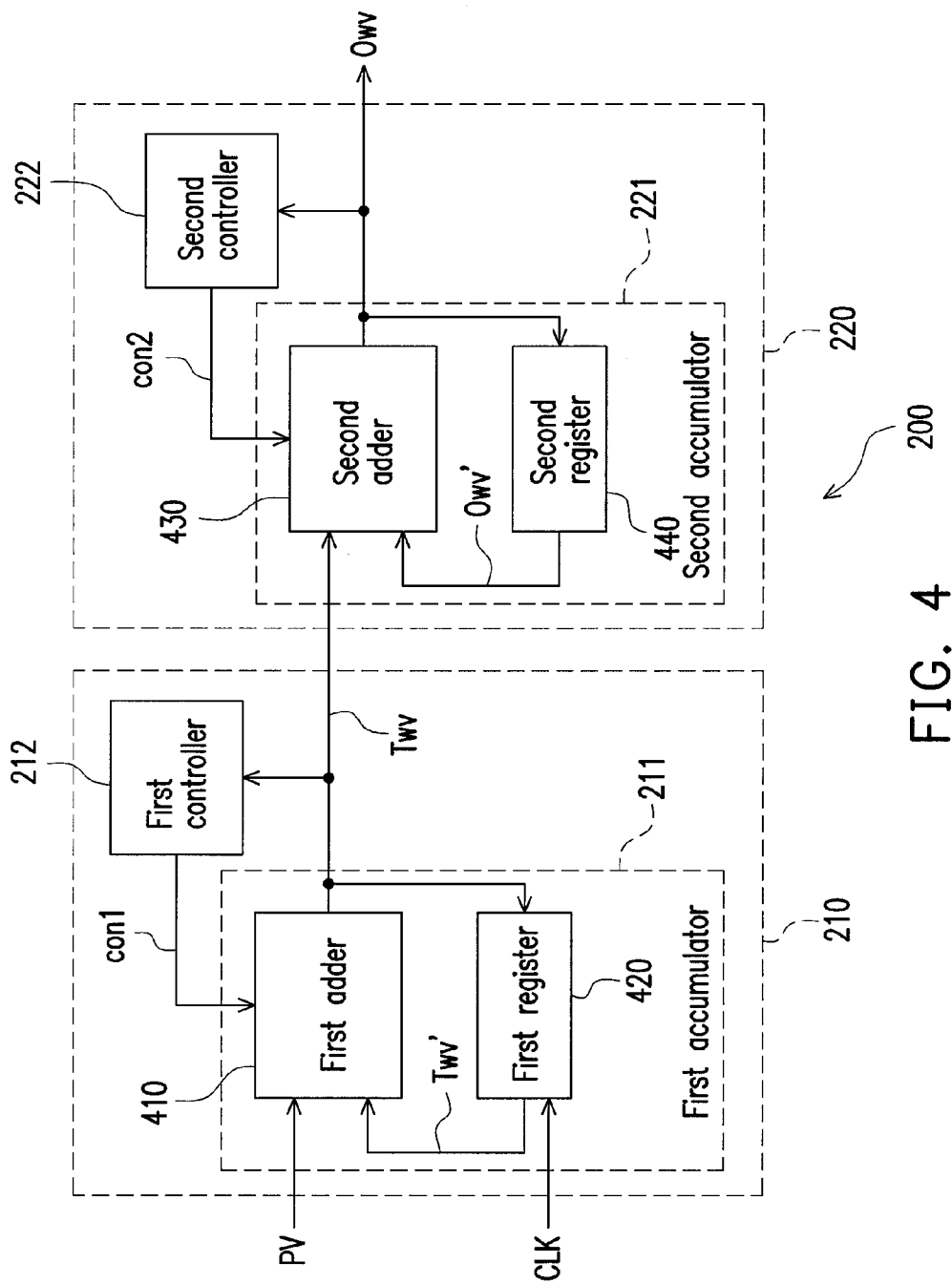
FIG. 4 illustrates an implementation example of the onion waveform generator in FIG. 2.

Those having ordinary knowledge in the art may implement the value generation unit 210 and the accumulating unit 220 based on foregoing description through any technique. FIG. 4 illustrates an implementation example of the onion waveform generator 200 in FIG. 4. The value generation unit 210 includes a first accumulator 211 and a first controller 212. The first accumulator 211 is triggered by the clock signal CLK for accumulating the predefined value PV to output the counting value Twv. The predefined value PV can be 1, 2 or other logic value. The first controller 212 is coupled to the first accumulator 211, and which checks the counting value Twv and outputs a control signal con1 to the first accumulator 211 according to the checking result, so as to control the accumulation mode of the first accumulator 211. The first controller 212 switches the accumulation mode of the first accumulator 211 from an increasing mode to a decreasing mode if the counting value Twv is the first boundary value, and the first controller 212 switches the accumulation mode of the first accumulator 211 from the decreasing mode to the increasing mode if the counting value Twv is the second boundary value.

As shown in FIG. 4, in the present embodiment, the first accumulator 211 includes a first adder 410 and a first register 420. The first register 420 coupled to the first adder 410 receives the clock signal CLK. The first register 420 records the counting value Twv output by the first adder 410 in accordance with the clock signal CLK, and provides a previous accumulation value Twv' to the first adder 410. The first adder 410 receives the predefined value PV and the previous accumulation value Twv' and selectively performs an additive operation or a subtractive operation under the control of the first controller 212 to output the counting value Twv. Namely, the counting value Twv may be either Twv'+PV or Twv'-PV according to the first controller 212.

Figure 5:
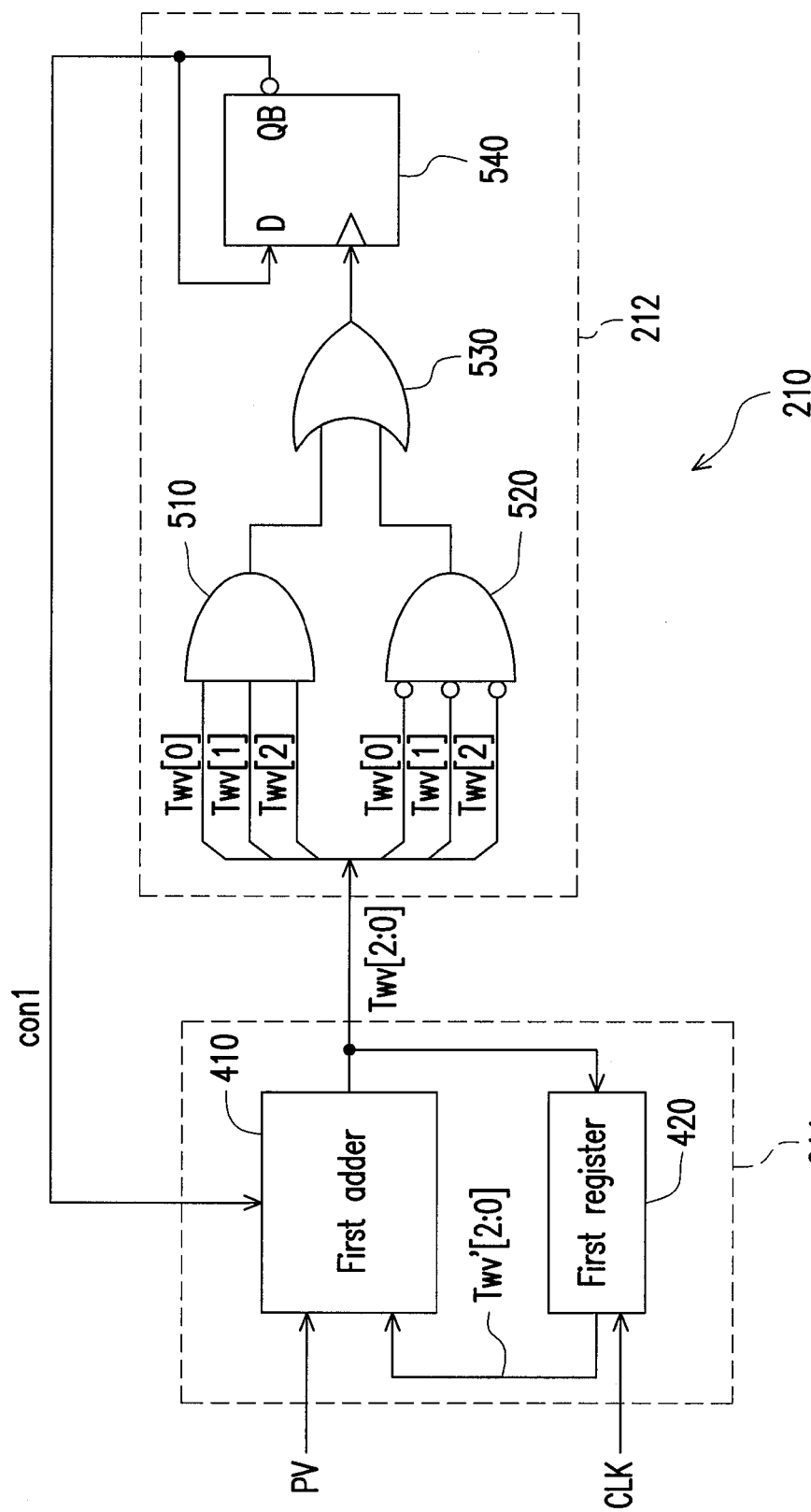
FIG. 5 illustrates an implementation example of a first controller in FIG. 4.

Those having ordinary knowledge in the art may determine the first boundary value and the second boundary value according to the actual design requirement and set the first boundary value and the second boundary value in the first controller 212. The first controller 212 may be implemented through any technique (for example, with a comparator, a microcontroller, a sequential logic circuit, a logic circuit, or a combination of aforementioned circuits). FIG. 5 illustrates an implementation example of the first controller 212 in FIG. 4. In FIG. 5, Twv[2:0] indicates that the counting value Twv has 3 bits Twv[2], Twv[1], and Twv[0]. The first controller 212 includes a first AND gate 510, a second AND gate 520, a first OR gate 530, and a first flip-flop 540. The first AND gate 510 has a first non-inverting input terminal, a second non-inverting input terminal, and a third non-inverting input terminal for respectively receiving the first bit Twv[0], the second bit Twv[1], and the third bit Twv[2] of the counting value Twv [2:0]. The second AND gate 520 has a first inverting input terminal, a second inverting input terminal, and a third inverting input terminal for respectively receiving the first bit Twv [0], the second bit Twv[1], and the third bit Twv[2] of the counting value Twv[2:0].

The first OR gate 530 has a first input terminal and a second input terminal respectively coupled to the output terminal of the first AND gate 510 and the output terminal of the second AND gate 520. A trigger terminal of the first flip-flop 540 is coupled to the output terminal of the first OR gate 530, an input terminal D of the first flip-flop 540 is coupled to the inverting output terminal QB of the first flip-flop 540, and the inverting output terminal QB of the first flip-flop 540 outputs the control signal con1 to the first accumulator 211 to control the accumulation mode of the first accumulator 211.

Referring to FIG. 4, the accumulating unit 220 includes a second accumulator 221 and a second controller 222. The second accumulator 221 accumulates the counting value Twv output by the value generation unit 210 to output the waveform value Owv. The second controller 222 is coupled to the second accumulator 221, and which checks the waveform value Owv and outputs a control signal con2 to the second accumulator 221 according to the checking result, so as to control the accumulation mode of the second accumulator 221. The second controller 222 switches the accumulation mode of the second accumulator 221 from an increasing mode to a decreasing mode if the waveform value Owv is the third boundary value, and the second controller 222 switches the accumulation mode of the second accumulator 221 from the decreasing mode to the increasing mode if the waveform value Owv is the fourth boundary value.

As shown in FIG. 4, in the present embodiment, the second accumulator 221 includes a second adder 430 and a second register 440. The second register 440 is coupled to the second adder 430, and which records the waveform value Owv and provides a previous accumulation value Owv' to the second adder 430. The second adder 430 receives the counting value Twv and the previous accumulation value Owv' and selectively performs an additive operation or a subtractive operation under the control of the second controller 222 to output the waveform value Owv. Namely, the waveform value Owv may be either Owv'+Twv or Owv'-Twv according to the second controller 222.

Figure 6:
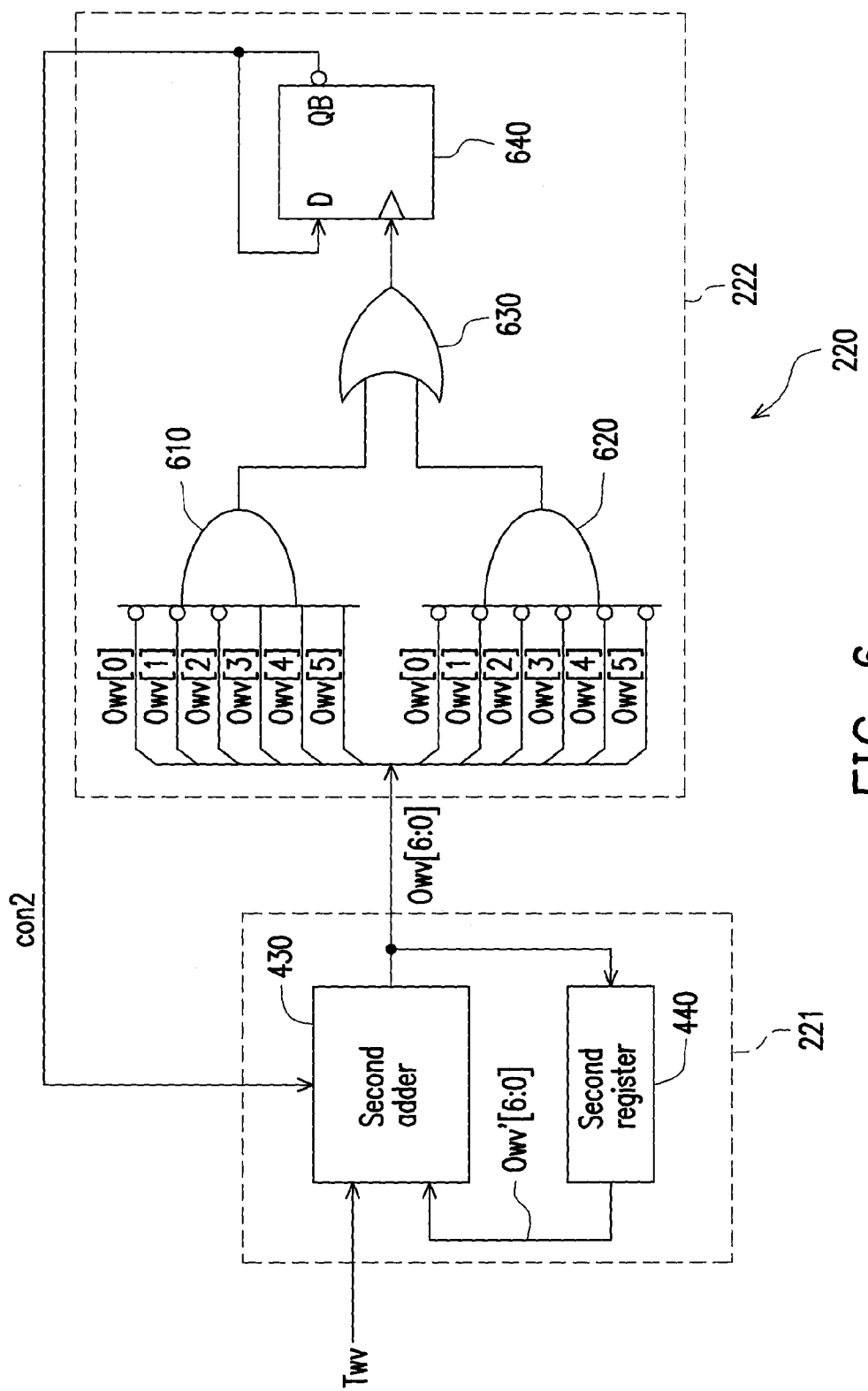
FIG. 6 illustrates an implementation example of a second controller in FIG. 4.

Those having ordinary knowledge in the art may determine the third boundary value and the fourth boundary value according to the actual design requirement and set the third boundary value and the fourth boundary value in the second controller 222. The second controller 222 may be implemented through any technique (for example, with a comparator, a microcontroller, a sequential logic circuit, a logic circuit, or a combination of aforementioned circuits). FIG. 6 illustrates an implementation example of the second controller 222 in FIG. 4. In FIG. 6, Owv[5:0] indicates that the waveform value Owv has 6 bits Owv[5], Owv[4], Owv[3], Owv[2], Owv[1], and Owv[0]. The second controller 222 includes a third AND gate 610, a fourth AND gate 620, a second OR gate 630, and a second flip-flop 640. The third AND gate 610 has three inverting input terminals and three non-inverting input terminals for respectively receiving the first bit Owv[0], the second bit Owv[1], the third bit Owv[2], the fourth bit Owv[3], the fifth bit Owv[4], and the sixth bit Owv[5] of the waveform value Owv. The output terminal of the third AND gate 610 outputs a corresponding first logic value.

The fourth AND gate 620 has six inverting input terminals for respectively receiving the first bit Owv[0], the second bit Owv[1], the third bit Owv[2], the fourth bit Owv[3], the fifth bit Owv[4], and the sixth bit Owv[5] of the waveform value Owv. The output terminal of the fourth AND gate 620 outputs a corresponding second logic value. The second OR gate 630 has a first input terminal and a second input terminal respectively coupled to the output terminal of the third AND gate 610 and the output terminal of the fourth AND gate 620. A trigger terminal of the second flip-flop 640 is coupled to the output terminal of the second OR gate 630, an input terminal D of the second flip-flop 640 is coupled to an inverting output terminal QB of the second flip-flop 640, and the inverting output terminal QB of the second flip-flop 640 outputs the control signal con2 to the second accumulator 221 to control the accumulation mode of the second accumulator 221.

Figure 8:
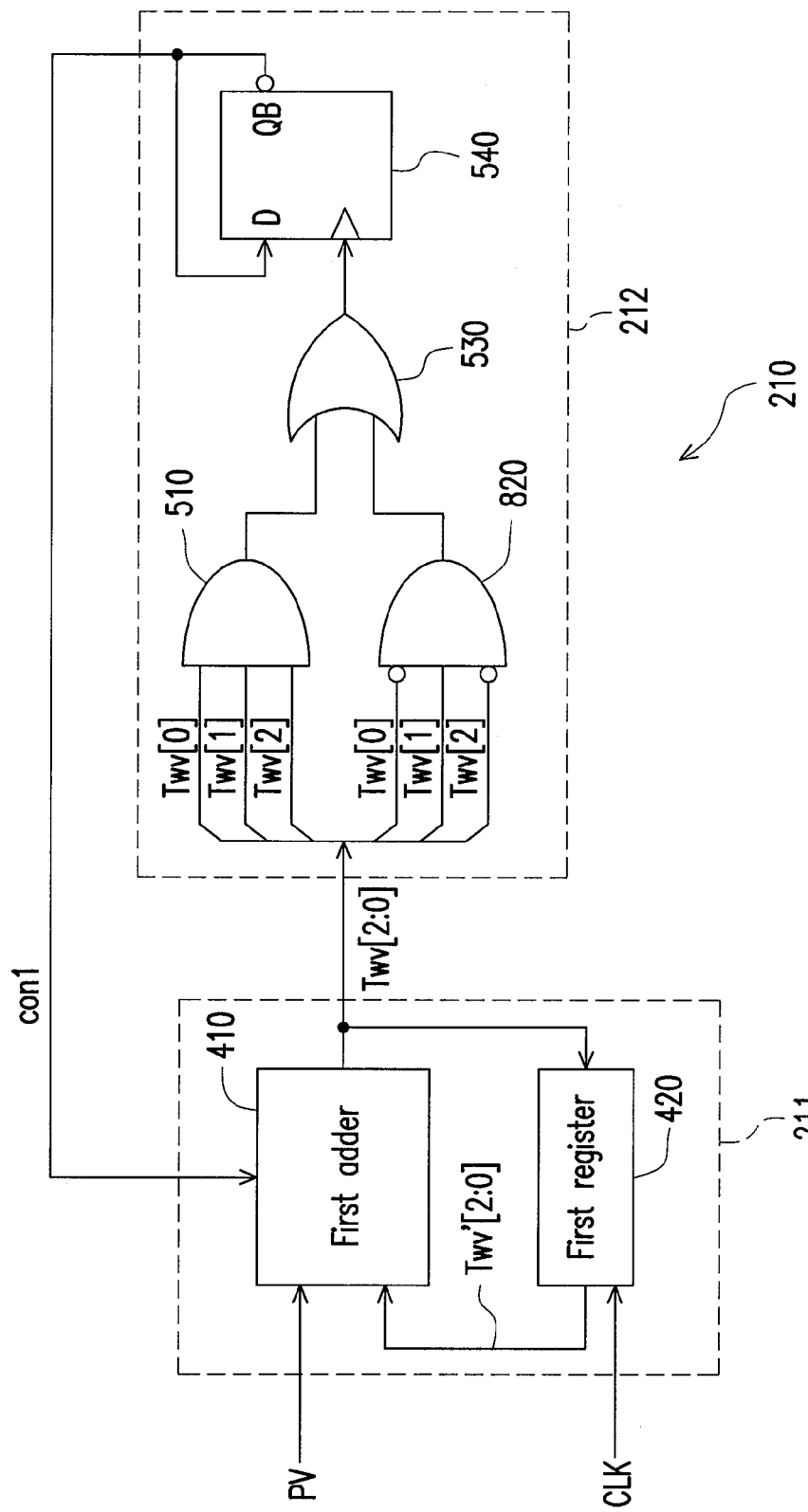
FIG. 8 is a schematic block diagram of a value generation unit according to another embodiment of the present disclosure.

In order to avoid such situation that the slope of the waveform corresponding to the waveform value Owv becomes 0, in the present embodiment, the second boundary value is set to 2. FIG. 8 is a schematic block diagram of the value generation unit 210 according to another embodiment of the present disclosure. The value generation unit 210 illustrated in FIG. 8 is similar to that illustrated in FIG. 5 therefore the similar part of the two will not be described herein. The difference between the two value generation units 210 is that the AND gate 520 is replaced with an AND gate 820 in the first controller 212 in FIG. 8. The AND gate 820 has an inverting input terminal, a non-inverting input terminal, and an inverting input terminal for respectively receiving the first bit Twv[0], the second bit Twv[1], and the third bit Twv[2] of the counting value Twv[2:0].

Figure 7:
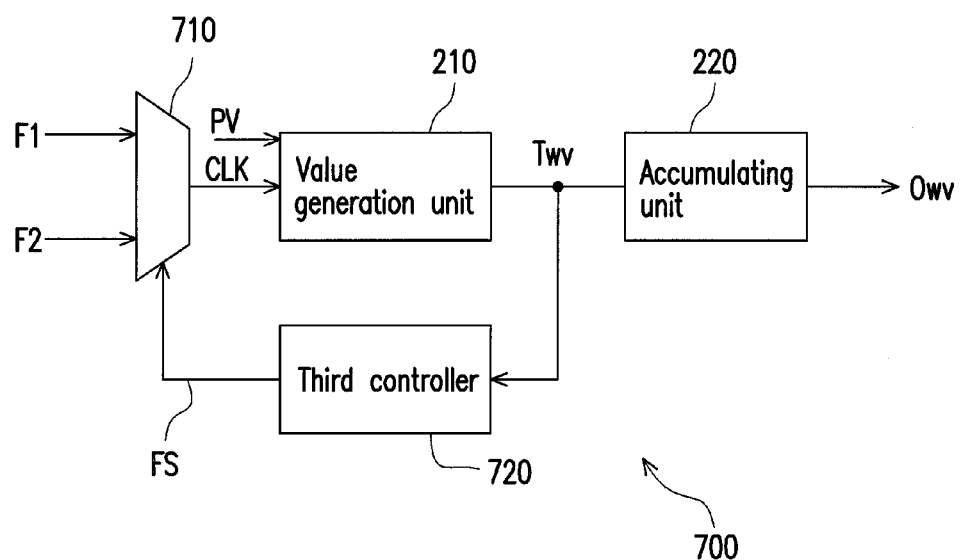
FIG. 7 is a schematic block diagram of an onion waveform generator according to another embodiment of the present disclosure.

FIG. 7 is a schematic block diagram of an onion waveform generator 700 according to another embodiment of the present disclosure. The onion waveform generator 700 illustrated in FIG. 7 is similar to the onion waveform generator 200 in FIG. 2 therefore the similar part will not be described herein. The difference between the two onion waveform generators is that the onion waveform generator 700 further includes a multiplexer 710 and a third controller 720. The multiplexer 710 may have at least two inputs for receiving signals of at least two frequencies as the clock signal CLK input to the value generation unit 210, such that the value generation unit 210 can be triggered by the clock signal CLK for accumulating the predefined value PV to generate a non-linear counting value Twv. Taking two signals of two different frequencies as an example, the first input terminal of the multiplexer 710 receives a first frequency signal F1, the second input terminal of the multiplexer 710 receives a second frequency signal F2, and the output terminal of the multiplexer 710 provides the clock signal CLK to the value generation unit 210. The first frequency signal F1 and the second frequency signal F2 may be two clock signals having different frequencies. The third controller 720 is coupled to the value generation unit 210 for detecting the counting value Twv. The third controller 720 outputs a control signal FS according to the counting value Twv so as to control the multiplexer 710 to selectively provide the first frequency signal F1 or the second frequency signal F2 to the value generation unit 210.

Figure 9:
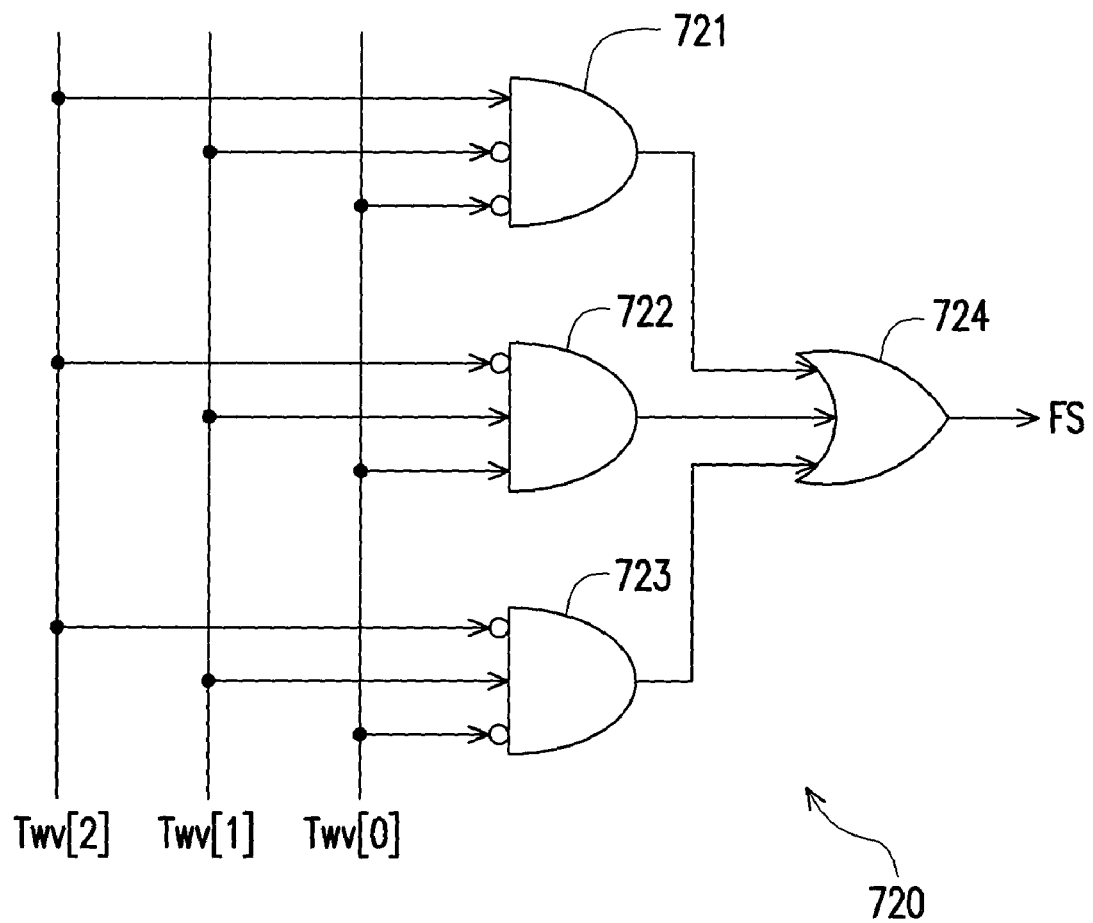
FIG. 9 is a schematic block diagram of a third controller in FIG. 7 according to an embodiment of the present disclosure.

Following descriptions depict how the onion waveform generator 700 generates a nonlinear counting value Twv. It is assumed that the frequency of the first frequency signal F1 is twice that of the second frequency signal F2. When the counting value Twv is 7, 6, and 5, the third controller 720 controls the multiplexer 710 to provide the first frequency signal F1 to the value generation unit 210. When the counting value Twv is 4, 3, and 2, the third controller 720 controls the multiplexer 710 to provide the second frequency signal F2 to the value generation unit 210, as shown in following table 2 and FIG. 10. FIG. 9 is a schematic block diagram of the third controller 720 in FIG. 7 according to an embodiment of the present disclosure. The third controller 720 includes an AND gate 721, an AND gate 722, an AND gate 723, and an OR gate 724. The AND gate 721 has two inverting input terminals and a non-inverting input terminal for respectively receiving the first bit Twv[0], the second bit Twv[1], and the third bit Twv[2] of the counting value Twv[2:0]. The AND gate 722 has two non-inverting input terminals and an inverting input terminal for respectively receiving the first bit Twv[0], the second bit Twv[1], and the third bit Twv[2] of the counting value Twv[2:0]. The AND gate 723 has an inverting input terminal, a non-inverting input terminal, and an inverting input terminal for respectively receiving the first bit Twv[0], the second bit Twv[1], and the third bit Twv[2] of the counting value Twv[2:0]. The OR gate 724 has three input terminals respectively coupled to the output terminals of the AND gates 721, 722, and 723, and the output terminal of the OR gate 724 provides the control signal FS to the multiplexer 710.

Figure 10:
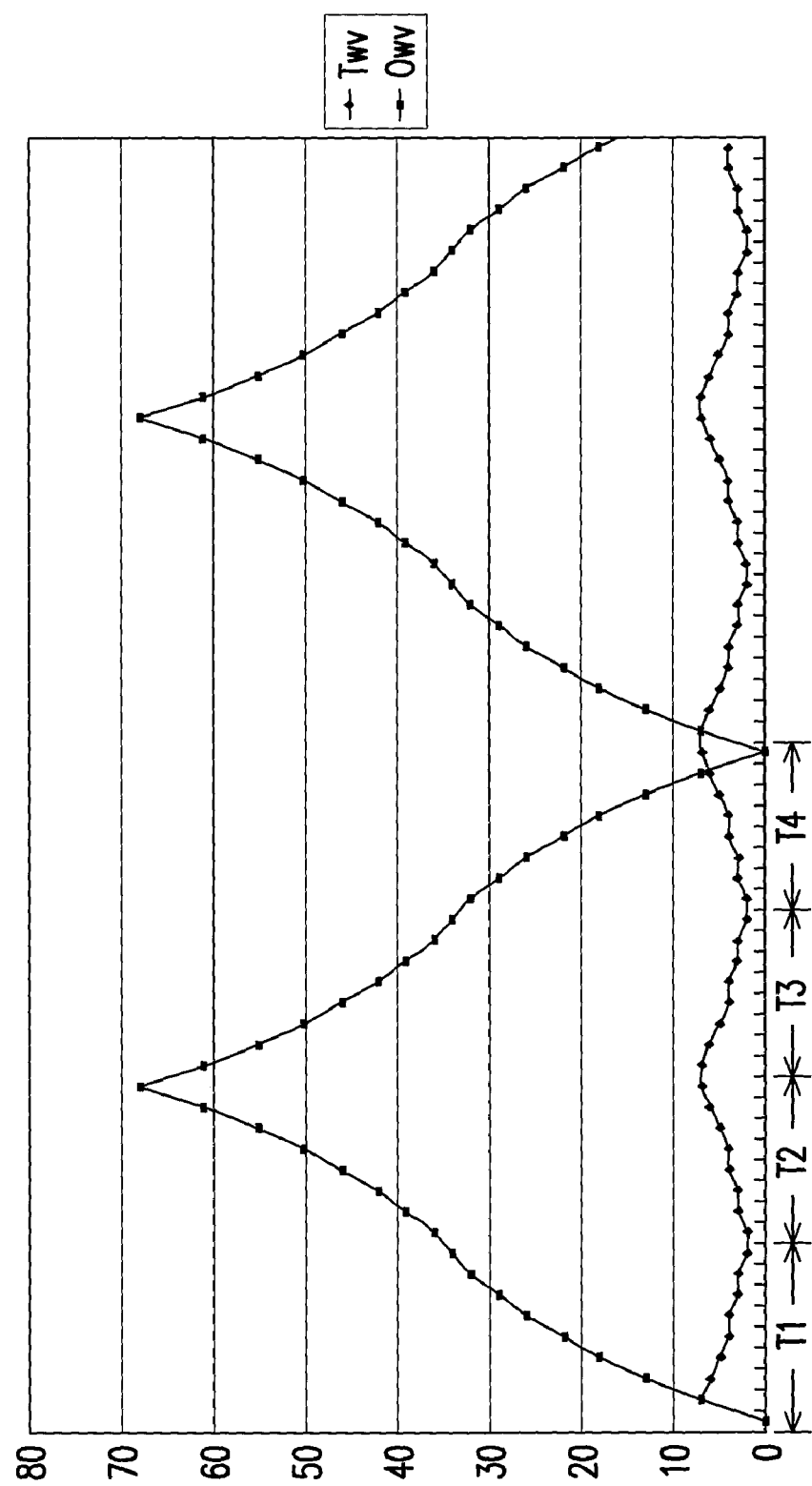
FIG. 10 illustrates waveforms of a counting value Twv and a waveform value Owv in FIG. 7 according to an embodiment of the present disclosure.

FIG. 10 illustrates the waveforms of the counting value Twv and the waveform value Owv in FIG. 7 according to an embodiment of the present disclosure. In the count-down mode (for example, the period T1 as shown in FIG. 10), the value generation unit 210 is triggered by the clock signal CLK for decreasingly counting/accumulating the predefined value PV (e.g. PV=1) starting from the first boundary value (for example, 7) to output the counting value Twv. When the counting value Twv is greater than or equal to 5, the third controller 720 controls the multiplexer 710 to provide the first frequency signal F1 to the value generation unit 210. Thus, the counting value Twv is sequentially 7, 6, 5, and 4. When the counting value Twv is smaller than or equal to 4, the third controller 720 controls the multiplexer 710 to provide the second frequency signal F2 to the value generation unit 210. Because the frequency of the second frequency signal F2 is half of that of the first frequency signal F1, the counting value Twv is sequentially 4, 4, 3, 3, and 2. During the period T1, the accumulating unit 220 operates in the increasing mode and accumulates the counting value Twv to sequentially output 7, 13, 18, 22, 26, 29, 32, and 34 as the waveform value Owv. Because the counting value Twv has reached the second boundary value (i.e., 2), the value generation unit 210 switches into the count-up mode.

In the count-up mode (for example, the period T2 as shown in FIG. 10), the value generation unit 210 increasingly counts the clock signal CLK (or accumulates the predefined value PV) to output the counting value Twv. Because the multiplexer 710 provides the second frequency signal F2 to the value generation unit 210, the counting value Twv is sequentially 2, 3, 3, 4, and 4. When the counting value Twv is greater than or equal to 5, the third controller 720 controls the multiplexer 710 to provide the first frequency signal F1 to the value generation unit 210. Thus, the counting value Twv is sequentially 5, 6, and 7. During the period T2, because the waveform value Owv has not yet reached the third boundary value (for example, 68), the accumulating unit 220 still operates in the increasing mode and accumulates the counting value Twv to sequentially output 36, 39, 42, 46, 50, 55, 61, and 68 as the waveform value Owv. Because the counting value Twv has reached the first boundary value (i.e., 7), the value generation unit 210 switches into the count-down mode. In addition, because the waveform value Owv has reached the third boundary value (i.e., 68), the accumulating unit 220 switches into the decreasing mode.

As described above, in the count-down mode (for example, the period T3 as shown in FIG. 10), the value generation unit 210 counts the clock signal CLK (or accumulates the predefined value PV) to sequentially output 7, 6, 5, 4, 4, 3, 3, and 2 as the counting value Twv. During the period T3, the accumulating unit 220 operates in the decreasing mode and accumulates the counting value Twv to sequentially output 61, 55, 50, 46, 42, 39, 36, and 34 as the waveform value Owv. Because the counting value Twv has already reached the second boundary value (i.e., 2), the value generation unit 210 switches into the count-up mode.

As described above, in the count-up mode (for example, the period T4 as shown in FIG. 10), the value generation unit 210 counts the clock signal CLK (or accumulates the pre-defined value PV) to sequentially output 2, 3, 3, 4, 4, 5, 6, and 7 as the counting value Twv. During the period T4, because the waveform value Owv has not yet reached the fourth boundary value (i.e., 0), the accumulating unit 220 still operates in the decreasing mode and accumulates the counting value Twv to sequentially output 32, 29, 26, 22, 18, 13, 7, and 0 as the waveform value Owv. Because the counting value Twv has reached the first boundary value (i.e., 7), the value generation unit 210 switches into the count-down mode. In addition, because the waveform value Owv has reached the fourth boundary value (i.e., 0), the accumulating unit 220 switches into the decreasing mode. The subsequent operation process can be deduced from foregoing description. The counting value Twv and the waveform value Owv are listed in following table 2.

TABLE 2

The counting value Twv and the waveform value Owv in FIG. 10

| Period | T1 | | | | | | | | T2 | | | | | | |
|---|---|---|---|---|---|---|---|---|---|---|---|---|---|---|---|
| Twv | 7 | 6 | 5 | 4 | 4 | 3 | 3 | 2 | 2 | 3 | 3 | 4 | 4 | 5 | 6 | 7 |
| Owv | 7 | 13 | 18 | 22 | 26 | 29 | 32 | 34 | 36 | 39 | 42 | 46 | 50 | 55 | 61 | 68 |
| Period | T3 | | | | | | | | T4 | | | | | | |
| Twv | 7 | 6 | 5 | 4 | 4 | 3 | 3 | 2 | 2 | 3 | 3 | 4 | 4 | 5 | 6 | 7 |
| Owv | 61 | 55 | 50 | 46 | 42 | 39 | 36 | 34 | 32 | 29 | 26 | 22 | 18 | 13 | 7 | 0 |

The first boundary value, the second boundary value, the third boundary value, the fourth boundary value, and the initial value of the value generation unit 210 are determined according to the actual design requirement. For example, the initial value of the value generation unit 210 is 0, the first boundary value is 7, the second boundary value is 0, the third boundary value is 28, and the fourth boundary value is −28. The operation process of the present example can be deduced based on foregoing description therefore will not be described herein. The counting value Twv and the waveform value Owv in the present example are listed in following table 3.

TABLE 3

The counting value Twv and the waveform value Owv

| Twv | 0 | 1 | 2 | 3 | 4 | 5 | 6 | 7 | 7 | 6 | 5 | 4 | 3 | 2 | 1 |
| Owv | 0 | 1 | 3 | 6 | 10 | 15 | 21 | 28 | 21 | 15 | 10 | 6 | 3 | 1 | 0 |
| Twv | 0 | 1 | 2 | 3 | 4 | 5 | 6 | 7 | 7 | 6 | 5 | 4 | 3 | 2 | 1 |
| Owv | 0 | −1 | −3 | −6 | −10 | −15 | −21 | −28 | −21 | −15 | −10 | −6 | −3 | −1 | 0 |

Figure 11:
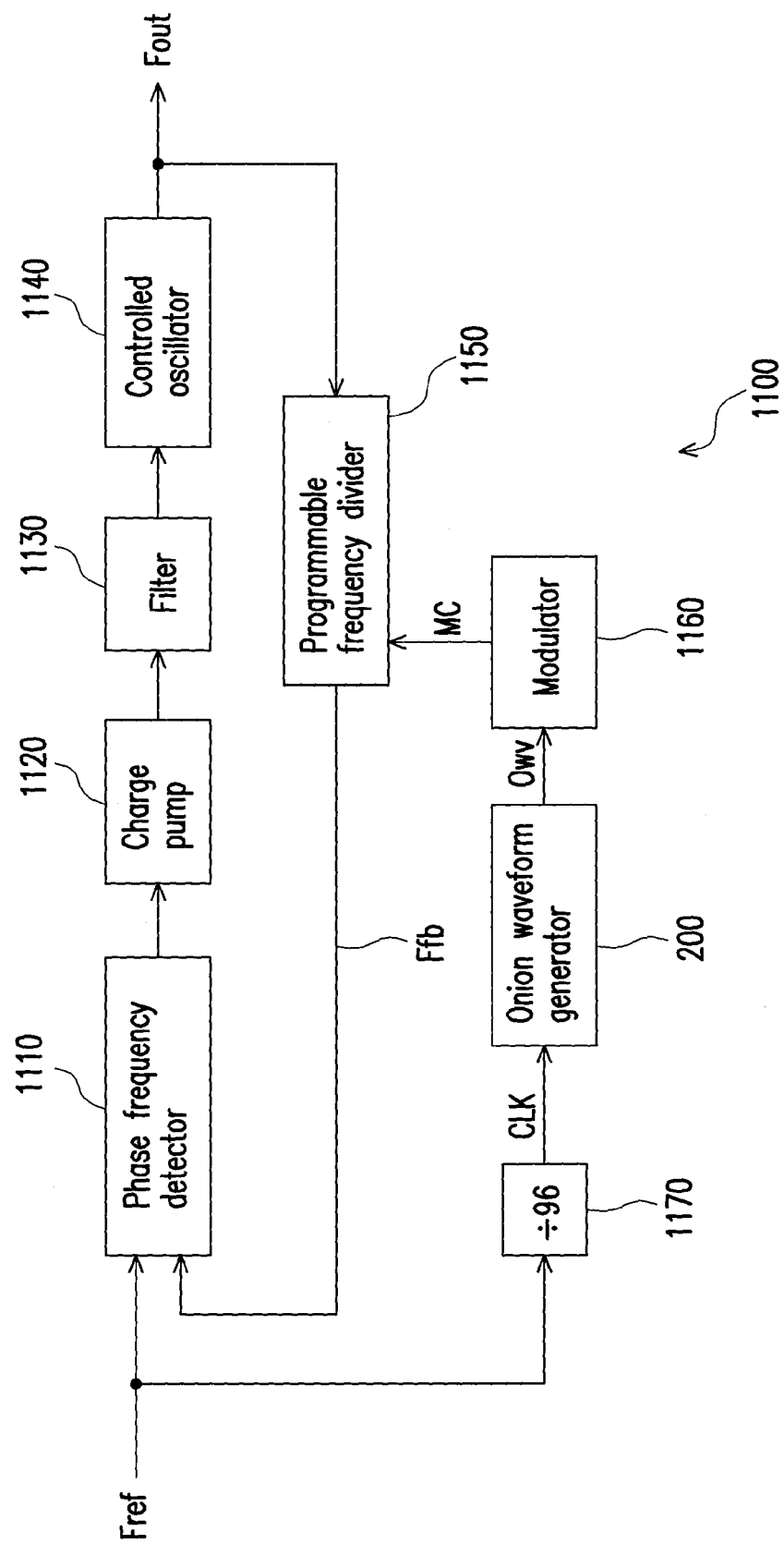
FIG. 11 is a schematic block diagram of a spread spectrum clock generator (SSCG) according to an embodiment of the present disclosure.

The application of the onion waveform generator 200 and the onion waveform generator 700 is not limited in the present disclosure. For example, the onion waveform generator 200 and the onion waveform generator 700 may be applied in a spread spectrum clock generator (SSCG). FIG. 11 is a schematic block diagram of a SSCG 1100 according to an embodiment of the present disclosure. Referring to FIG. 11, the SSCG 1100 includes a phase frequency detector (PFD) 1110, a charge pump (CP) 1120, a filter 1130, a controlled oscillator 1140, a programmable frequency divider 1150, a modulator 1160, an onion waveform generator 200, and a frequency divider 1170.

The PFD 1110 receives and detects the phase difference (time difference) between a reference clock Fref and a feedback clock Ffb to obtain a detection result and sends the detection result to the CP 1120 to control the charge or discharge of the CP 1120. The current produced by the CP 1120 is conducted into the filter 1130. The input terminal of the filter 1130 is coupled to the PFD 1110 through the CP 1120 so that a control voltage of the controlled oscillator 1140 can be generated according to the detection result. In the present embodiment, the filter 1130 is a low pass filter (LPF).

The control terminal of the controlled oscillator 1140 is coupled to the output terminal of the filter 1130, and the output terminal of the controlled oscillator 1140 provides a spread spectrum clock Fout. In the present embodiment, the controlled oscillator 1140 is a voltage controlled oscillator (VCO). The input terminal of the programmable frequency divider 1150 is coupled to the output terminal of the controlled oscillator 1140, and the output terminal of the programmable frequency divider 1150 provides the feedback clock Ffb to the PFD 1110. The programmable frequency divider 1150 is controlled by a modulation control signal MC to dynamically determine the frequency of the feedback clock Ffb.

Below, the SSCG 1100 is applied to the serial advanced technology attachment (SATA). Because the SATA specifies that the modulation frequency of spread spectrum is between 30K and 33K, the frequency of the reference clock Fref is 100 MHz, and the frequency of the spread spectrum clock Fout may be 6-GHz. The programmable frequency divider 1150 determines whether to divide the frequency of the spread spectrum clock Fout by 58 or 60 according to the modulation control signal MC. Thus, the frequency of the feedback clock Ffb is 6÷58 GHz or 6÷60 GHz according to the modulation control signal MC. In another embodiment, the programmable frequency divider 1150 dynamically determines whether to divide the frequency of the spread spectrum clock Fout by 56, 58, 60, or 62 according to the modulation control signal MC. Thus, the frequency of the feedback clock Ffb may be 6÷56 GHz, 6÷58 GHz, 6÷60 GHz, or 6÷62 GHz according to the modulation control signal MC.

The frequency divider 1170 receives the reference clock Fref and divides the frequency of the reference clock Fref by a specific multiple (for example, 96) to provide the clock signal CLK to the value generation unit 210 of the onion waveform generator 200, wherein the multiple is determined according to the frequency and the order of the modulation waveform. In some embodiment, the clock signal CLK may be the reference clock Fref. Namely, the frequency divider 1170 may be omitted according to the design requirement. The onion waveform generator 200 generates the waveform value Owv for the modulator 1160 according to the clock signal CLK. The onion waveform generator 200 has been described above in detail therefore will not be described herein.

The modulator 1160 generates the modulation control signal MC for the programmable frequency divider 1150 according to the waveform value Owv. In the present embodiment, the modulator 1160 is a delta-sigma (ΔΣ) modulator. The PFD 1110, the CP 1120, the filter 1130, the controlled oscillator 1140, the programmable frequency divider 1150, the modulator 1160, and the frequency divider 1170 are well known techniques in the art therefore will not be described herein.

Figure 12:
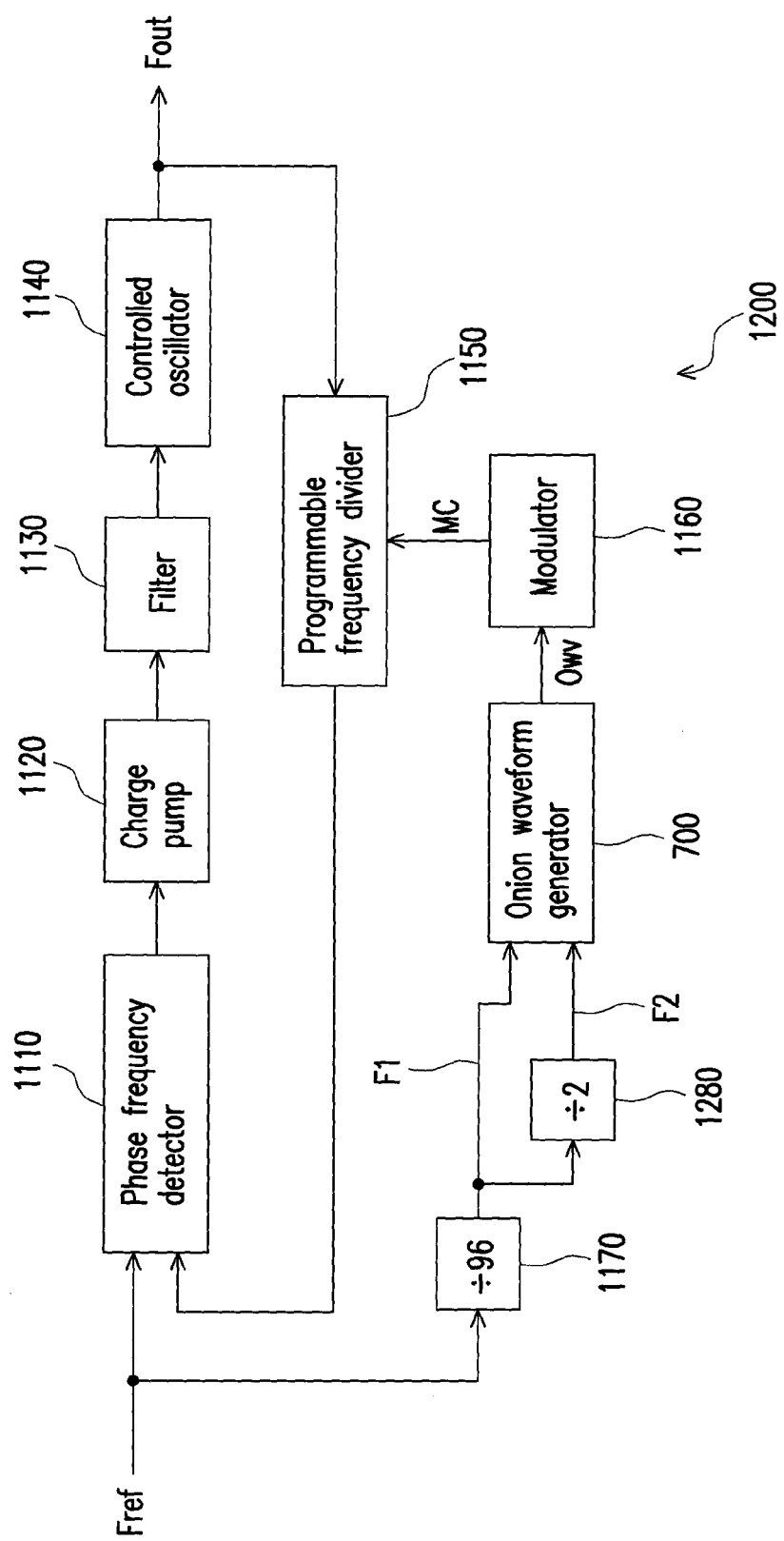
FIG. 12 is a schematic block diagram of a SSCG according to another embodiment of the present disclosure.

FIG. 12 is a schematic block diagram of a SSCG 1200 according to another embodiment of the present disclosure. Referring to FIG. 12, the first frequency divider 1170 receives a reference clock Fref and divides the frequency of the reference clock Fref to provide a first frequency signal F1 to the multiplexer 710 of the onion waveform generator 700. The second frequency divider 1280 receives the first frequency signal F1 and divides the frequency of the first frequency signal F1 to provide a second frequency signal F2 to the multiplexer 710 of the onion waveform generator 700. The frequency division multiple of the second frequency divider 1280 is determined according to the actual design requirement. Herein the second frequency divider 1280 is a divide-by-2 frequency divider. The onion waveform generator 700 generates a waveform value Owv for the modulator 1160 according to the first frequency signal F1 and the second frequency signal F2. The onion waveform generator 700 has been described above in detail, and other components of the SSCG 1200 are the same as those of the SSCG 1100 therefore will not be described herein.

As described above, in embodiments of the present disclosure, the nonlinear onion waveform generators 200 and 700 are realized by adopting a value generation unit 210 and an accumulating unit 220. In the SSCG 1100 or the SSCG 1200 that uses such an onion waveform generator for modulation, the spectral energy is evenly distributed on the extended frequencies, and the problem of raised spectrum ends is effectively resolved. Thereby, a satisfactory spread spectrum effect is achieved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An onion waveform generator, comprising:
   a value generation unit, for outputting a counting value, wherein the value generation unit switches from an increasing mode to a decreasing mode if the counting value is a first boundary value, and the value generation unit switches from the decreasing mode to the increasing mode if the counting value is a second boundary value; and
   an accumulating unit, coupled to the value generation unit, for accumulating the counting value to output a waveform value, wherein the accumulating unit switches from the increasing mode to the decreasing mode if the waveform value is a third boundary value, and the accumulating unit switches from the decreasing mode to the increasing mode if the waveform value is a fourth boundary value.

2. The onion waveform generator according to claim 1, wherein the value generation unit comprises:
   an accumulator, for accumulating a clock signal to output the counting value; and
   a controller, coupled to the accumulator, for checking the counting value and controlling an accumulation mode of the accumulator, wherein the controller switches the accumulation mode of the accumulator from an increasing mode to a decreasing mode if the counting value is the first boundary value, and the controller switches the accumulation mode of the accumulator from the decreasing mode to the increasing mode if the counting value is the second boundary value.

3. The onion waveform generator according to claim 2, wherein the accumulator comprises:
   an adder, coupling to a predefined value and a previous accumulation value and selectively performing an additive operation or a subtractive operation under control of the controller to output the counting value; and
   a register, for receiving the clock signal and coupled to the adder, for recording the counting value and providing the previous accumulation value to the adder.

4. The onion waveform generator according to claim 2, wherein the controller comprises:
   a first AND gate, having a first non-inverting input terminal, a second non-inverting input terminal, and a third non-inverting input terminal for respectively receiving a first bit, second bit, and a third bit of the counting value;

a second AND gate, having a first inverting input terminal, a second inverting input terminal, and a third inverting input terminal for respectively receiving the first bit, the second bit, and the third bit of the counting value;

a first OR gate, having a first input terminal and a second input terminal respectively coupled to an output terminal of the first AND gate and an output terminal of the second AND gate; and a first flip-flop, having a trigger terminal coupled to an output terminal of the first OR gate, an input terminal coupled to an inverting output terminal of the first flip-flop, and the inverting output terminal for controlling the accumulation mode of the accumulator.

5. The onion waveform generator according to claim 2, wherein the controller comprises:

a first AND gate, having a first non-inverting input terminal, a second non-inverting input terminal, and a third non-inverting input terminal for respectively receiving a first bit, a second bit, and a third bit of the counting value;

a second AND gate, having a first inverting input terminal, a second non-inverting input terminal, and a third inverting input terminal for respectively receiving the first bit, the second bit, and the third bit of the counting value;

a first OR gate, having a first input terminal and a second input terminal respectively coupled to an output terminal of the first AND gate and an output terminal of the second AND gate; and a first flip-flop, having a trigger terminal coupled to an output terminal of the first OR gate, an input terminal coupled to an inverting output terminal of the first flip-flop, and the inverting output terminal for controlling the accumulation mode of the accumulator.

6. The onion waveform generator according to claim 1, wherein the value generation unit comprises:

a finite state machine, for generating a state value as the counting value, wherein the counting value is between the first boundary value and the second boundary value.

7. The onion waveform generator according to claim 1, wherein the accumulating unit comprises:

an accumulator, for accumulating the counting value to output the waveform value; and a controller, coupled to the accumulator, for checking the waveform value and controlling an accumulation mode of the accumulator, wherein the controller switches the accumulation mode of the accumulator from an increasing mode to a decreasing mode if the waveform value is the third boundary value, and the controller switches the accumulation mode of the accumulator from the decreasing mode to the increasing mode if the waveform value is the fourth boundary value.

8. The onion waveform generator according to claim 7, wherein the accumulator comprises:

an adder, for receiving the counting value and a previous accumulation value and selectively performing an additive operation or a subtractive operation under control of the controller to output the waveform value; and a register, coupled to the adder, for recording the waveform value and providing the previous accumulation value to the adder.

9. The onion waveform generator according to claim 7, wherein the controller comprises:

a third AND gate, for receiving the waveform value and outputting a corresponding first logic value;

a fourth AND gate, for receiving the waveform value and outputting a corresponding second logic value;

a second OR gate, having a first input terminal and a second input terminal respectively coupled to an output terminal of the third AND gate and an output terminal of the fourth AND gate; and a second flip-flop, having a trigger terminal coupled to an output terminal of the second OR gate, an input terminal coupled to an inverting output terminal of the second flip-flop, and the inverting output terminal for controlling the accumulation mode of the accumulator.

10. The onion waveform generator according to claim 1, wherein the value generation unit comprises a counter, and the counter counts a clock signal to output the counting value, wherein the counter switches from a count-up mode to a count-down mode if the counting value is the first boundary value, and the counter switches from the count-down mode to the count-up mode if the counting value is the second boundary value.

11. The onion waveform generator according to claim 1 further comprising:

a multiplexer, having at least two input terminals for receiving clock signals of different frequencies and an output terminal for providing a clock signal to the value generation unit; and a controller, coupled to the value generation unit, for controlling the multiplexer according to the counting value.

12. The onion waveform generator according to claim 10, wherein the accumulating unit changes an accumulation mode of the accumulating unit when the counting value reaches the first boundary value.

13. The onion waveform generator according to claim 10, wherein the counter is a linear counter, a nonlinear counter, or a finite state machine (FSM).

14. A spread spectrum clock generator (SSCG), comprising:

a phase frequency detector (PFD), for receiving and detecting a phase difference between a reference clock and a feedback clock to obtain a detection result;

a filter, having an input terminal coupled to the PFD for receiving the detection result;

a controlled oscillator, having a control terminal coupled to an output terminal of the filter and an output terminal for providing a spread spectrum clock;

a programmable frequency divider, having an input terminal coupled to the output terminal of the controlled oscillator and an output terminal for providing the feedback clock to the PFD, wherein the programmable frequency divider is controlled by a modulation control signal to dynamically determine a frequency of the feedback clock;

a modulator, for generating the modulation control signal according to a waveform value; and an onion waveform generator, comprising:

a value generation unit, for outputting a counting value, wherein the value generation unit switches from an increasing mode to a decreasing mode if the counting value is a first boundary value, and the value generation unit switches from the decreasing mode to the increasing mode if the counting value is a second boundary value; and an accumulating unit, coupled to the value generation unit, for accumulating the counting value to output the waveform value to the modulator, wherein the accumulating unit switches from the increasing mode to the decreasing mode if the waveform value is a third boundary value, and the accumulating unit switches from the decreasing mode to the increasing mode if the waveform value is a fourth boundary value.

15. The SSCG according to claim 14, wherein the value generation unit comprises:
an accumulator, for accumulating a clock signal to output the counting value; and
a controller, coupled to the accumulator for checking the counting value and controlling an accumulation mode of the accumulator, wherein the controller switches the accumulation mode of the accumulator from an increasing mode to a decreasing mode if the counting value is the first boundary value, and the controller switches the accumulation mode of the accumulator from a decreasing mode to an increasing mode if the counting value is the second boundary value.

16. The SSCG according to claim 15, wherein the accumulator comprises:
an adder, coupling to a predefined value and a previous accumulation value and selectively performing an additive operation or a subtractive operation under control of the controller to output the counting value; and
a register, for receiving the clock signal and coupled to the adder, for recording the counting value and providing the previous accumulation value to the adder.

17. The SSCG according to claim 15, wherein the controller comprises:
a first AND gate, having a first non-inverting input terminal, a second non-inverting input terminal, and a third non-inverting input terminal for respectively receiving a first bit, a second bit, and a third bit of the counting value;
a second AND gate, having a first inverting input terminal, a second inverting input terminal, and a third inverting input terminal for respectively receiving the first bit, the second bit, and the third bit of the counting value;
a first OR gate, having a first input terminal and a second input terminal respectively coupled to an output terminal of the first AND gate and an output terminal of the second AND gate; and
a first flip-flop, having a trigger terminal coupled to an output terminal of the first OR gate, an input terminal coupled to an inverting output terminal of the first flip-flop, and the inverting output terminal for controlling the accumulation mode of the accumulator.

18. The SSCG according to claim 14, wherein the value generation unit comprises:
a finite state machine, for generating a state value as the counting value, wherein the counting value is between the first boundary value and the second boundary value.

19. The SSCG according to claim 14, wherein the accumulating unit comprises:
an accumulator, for accumulating the counting value to output the waveform value; and
a controller, coupled to the accumulator, for checking the waveform value and controlling an accumulation mode of the accumulator, wherein the controller switches the accumulation mode of the accumulator from an increasing mode to a decreasing mode if the waveform value is the third boundary value, and the controller switches the accumulation mode of the accumulator from the decreasing mode to the increasing mode if the waveform value is the fourth boundary value.

20. The SSCG according to claim 19, wherein the accumulator comprises:
an adder, for receiving the counting value and a previous accumulation value and selectively performing an additive operation or a subtractive operation under control of the controller to output the waveform value; and
a register, coupled to the adder, for recording the waveform value and providing the previous accumulation value to the adder.

21. The SSCG according to claim 19, wherein the controller comprises:
a third AND gate, for receiving the waveform value and outputting a corresponding first logic value;
a fourth AND gate, for receiving the waveform value and outputting a corresponding second logic value;
a second OR gate, having a first input terminal and a second input terminal respectively coupled to an output tell final of the third AND gate and an output terminal of the fourth AND gate; and
a second flip-flop, having a trigger terminal coupled to an output terminal of the second OR gate, an input terminal coupled to an inverting output terminal of the second flip-flop, and the inverting output terminal for controlling the accumulation mode of the accumulator.

22. The SSCG according to claim 14, wherein the value generation unit comprises a counter, and the counter counts a clock signal to output the counting value, wherein the counter switches from a count-up mode to a count-down mode if the counting value is the first boundary value, and the counter switches from the count-down mode to the count-up mode if the counting value is the second boundary value.

23. The SSCG according to claim 14 further comprising:
a multiplexer, having a first input terminal for receiving a first frequency signal, a second input terminal for receiving a second frequency signal, and an output terminal for providing a clock signal to the value generation unit; and
a controller, coupled to the value generation unit, for controlling the multiplexer according to the counting value.

24. The SSCG according to claim 23 further comprising:
a first frequency divider, for receiving the reference clock and dividing a frequency of the reference clock to provide the first frequency signal to the multiplexer; and
a second frequency divider, for receiving the first frequency signal and dividing a frequency of the first frequency signal to provide the second frequency signal to the multiplexer.

25. The SSCG according to claim 22 further comprising a frequency divider, wherein the frequency divider receives the reference clock and divides a frequency of the reference clock to provide the clock signal to the counter.

26. The SSCG according to claim 22, wherein the clock signal is the reference clock.

27. The SSCG according to claim 22, wherein the accumulating unit changes an accumulation mode of the accumulating unit when the counting value reaches the first boundary value.

28. The SSCG according to claim 22, wherein the counter is a linear counter, a nonlinear counter, or a FSM.

29. The SSCG according to claim 14, wherein the filter is a low pass filter (LPF).

30. The SSCG according to claim 14, wherein the controlled oscillator is a voltage controlled oscillator (VCO).

31. The SSCG according to claim 14, wherein the modulator is a delta-sigma ($\Delta\Sigma$) modulator.

32. The SSCG according to claim 14 further comprising a CP coupled between the PFD and the filter.

* * * * *